United States Patent
Lin et al.

(10) Patent No.: US 10,366,950 B2
(45) Date of Patent: Jul. 30, 2019

(54) BOTTOM-UP SELECTIVE DIELECTRIC CROSS-LINKING TO PREVENT VIA LANDING SHORTS

(71) Applicant: Intel Corporation, Santa Clara, CA (US)

(72) Inventors: Kevin Lin, Beaverton, OR (US); Robert Lindsey Bristol, Portland, OR (US); James M. Blackwell, Portland, OR (US); Rami Hourani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/575,808

(22) PCT Filed: Jun. 26, 2015

(86) PCT No.: PCT/US2015/038167
§ 371 (c)(1),
(2) Date: Nov. 20, 2017

(87) PCT Pub. No.: WO2016/209296
PCT Pub. Date: Dec. 29, 2016

(65) Prior Publication Data
US 2018/0204797 A1  Jul. 19, 2018

(51) Int. Cl.
*H01L 23/52* (2006.01)
*H01L 21/31* (2006.01)
(Continued)

(52) U.S. Cl.
CPC .... *H01L 23/5226* (2013.01); *H01L 21/02282* (2013.01); *H01L 21/31144* (2013.01);
(Continued)

(58) Field of Classification Search
CPC ........... H01L 23/5226; H01L 21/02282; H01L 21/31144; H01L 21/321; H01L 21/76816;
(Continued)

(56) References Cited

U.S. PATENT DOCUMENTS 6,040,604 A * 3/2000 Lauvray ............... H01L 23/60
257/355
8,080,878 B2  12/2011 Ueki et al.
(Continued)

FOREIGN PATENT DOCUMENTS

JP  2010-093235  4/2010
WO  WO 2015/0026342  2/2015

OTHER PUBLICATIONS

International Preliminary Report on Patentability for International Patent Application No. PCT/US2015/038167, dated Jan. 4, 2018, 8 pages.
International Search Report and Written Opinion for International Patent Application No. PCT/US2015/038167 dated Mar. 28, 2016, 10 pgs.
Search Report for European Patent Appplicaiton No. 15896579.8, dated Jan. 29, 2019, 9 pgs.

*Primary Examiner* — Didarul A Mazumder
(74) *Attorney, Agent, or Firm* — Schwabe, Williamson & Wyatt, P.C.

(57) ABSTRACT

Embodiments of the invention include an interconnect structure with a via and methods of forming such structures. In an embodiment, the interconnect structure comprises a first interlayer dielectric (ILD). A first interconnect line and a second interconnect line extend into the first ILD. According to an embodiment, a second ILD is positioned over the first interconnect line and the second interconnect line. A via may extend through the second ILD and electrically coupled to the first interconnect line. Additionally, embodiments of the invention include a portion of a bottom surface of the via being positioned over the second interconnect line. However, an isolation layer may be positioned between the bottom surface of the via and a top surface of the second interconnect line, according to an embodiment of the invention.

15 Claims, 9 Drawing Sheets

(51) Int. Cl.
  *H01L 21/76* (2006.01)
  *H01L 23/532* (2006.01)
  *H01L 23/522* (2006.01)
  *H01L 21/02* (2006.01)
  *H01L 21/311* (2006.01)
  *H01L 21/321* (2006.01)
  *H01L 21/768* (2006.01)

(52) U.S. Cl.
  CPC ...... *H01L 21/321* (2013.01); *H01L 21/76816* (2013.01); *H01L 21/76831* (2013.01); *H01L 21/76834* (2013.01); *H01L 21/76849* (2013.01); *H01L 21/76877* (2013.01); *H01L 23/53209* (2013.01); *H01L 23/53295* (2013.01)

(58) Field of Classification Search
  CPC ......... H01L 21/76831; H01L 21/76834; H01L 21/76849; H01L 21/76877; H01L 23/53209; H01L 23/53295
  USPC .................. 257/751; 438/627, 643, 653, 927
  See application file for complete search history.

(56) References Cited

U.S. PATENT DOCUMENTS

| | | | |
|---|---|---|---|
| 2002/0197849 A1* | 12/2002 | Mandal | C23C 16/401 438/633 |
| 2004/0004290 A1 | 1/2004 | Furukawa | |
| 2008/0184805 A1* | 8/2008 | Cheng | G01R 31/2858 73/788 |
| 2009/0302475 A1 | 12/2009 | Korogi et al. | |
| 2014/0117558 A1 | 5/2014 | Boyanov | |
| 2015/0021779 A1 | 1/2015 | Liou et al. | |
| 2015/0076695 A1 | 3/2015 | Cheng et al. | |
| 2015/0091174 A1 | 4/2015 | Clarke | |
| 2015/0171007 A1* | 6/2015 | Huang | H01L 23/5226 257/774 |
| 2015/0279785 A1* | 10/2015 | Hong | H01L 21/0214 257/774 |
| 2016/0240428 A1* | 8/2016 | Tung | H01L 21/7682 |

* cited by examiner

BOTTOM-UP SELECTIVE DIELECTRIC CROSS-LINKING TO PREVENT VIA LANDING SHORTS

CROSS-REFERENCE TO RELATED APPLICATION

This patent application is a U.S. National Phase Application under 35 U.S.C. § 371 of International Application No. PCT/US2015/038167, filed Jun. 26, 2015, entitled "BOTTOM-UP SELECTIVE DIELECTRIC CROSS-LINKING TO PREVENT VIA LANDING SHORTS," which designates the United States of America, the entire disclosure of which is hereby incorporated by reference in its entirety and for all purposes.

FIELD OF THE INVENTION

Embodiments of the present invention relate generally to the manufacture of semiconductor devices. In particular, embodiments of the present invention relate to interconnect structures for semiconductor devices and methods for manufacturing such devices.

BACKGROUND OF THE INVENTION

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch.

When patterning extremely small vias with extremely small pitches by such lithographic processes, several challenges present themselves, especially when the pitches are around 70 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Thus, improvements are needed in the area of via manufacturing technologies.

DETAILED DESCRIPTION OF THE INVENTION

Described herein are systems that include a substrate with multiple layers with varying compositions and methods of depositing and patterning such layers. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As described above, overlay between the vias and the overlying interconnects, and the overlay between the vias and the underlying landing interconnects is a critical issue to be resolved when the pitch of the interconnect and vias continue to decrease. For example, in FIG. 1A an interconnect structure that includes a plurality of interconnect lines $120_A$-$120_C$ formed through a hardmask 105 and into an interlayer dielectric (ILD) 103 is shown. An etchstop layer 107 and a second ILD 165 may be formed over the hardmask 105. A via opening may then be formed by patterning a resist layer 160 with radiation 195. It is to be appreciated that the resist layer 160 may further comprise a multi-layer hardmask/resist layer stack. For example, in a "trilayer" stack, a silicon-rich layer may be formed over the second ILD 165, a carbon-rich layer may be formed over the silicon-rich layer, and the resist layer 160 may be formed over the carbon-rich layer. Additionally it is to be appreciated that the etchstop layer 107 and the hardmask 105 are each represented as a single material in the Figures, though embodiments are not limited to such configurations. For example, the hardmask 105 may include a stack of one or more different hardmask materials and the etchstop layer 107 may include a stack of one or more different etchstop materials.

Figure 1A:
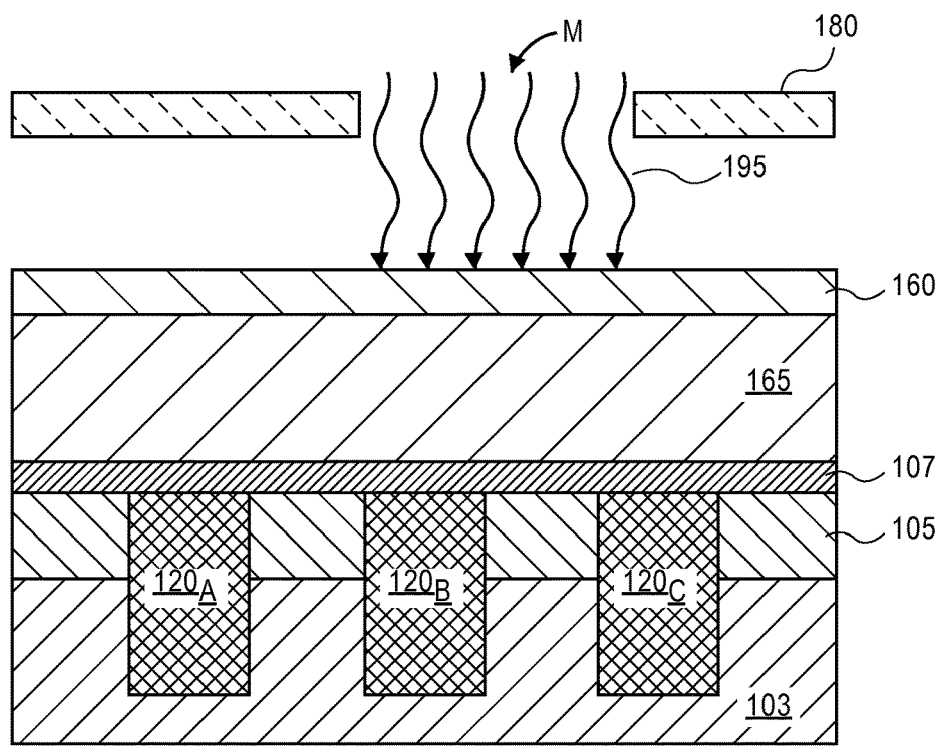
FIG. 1A is a cross-sectional illustration of an interconnect structure being patterned with an exposure mask, according to an embodiment.

In order to ensure that the via opening only contacts the targeted interconnect line $120_B$, an exposure mask 180 is ideally aligned so that a mask opening M is centered over the interconnect line $120_B$. However, due to the scaling down of the pitch and critical dimension of the interconnect lines 120, as described above, it is increasingly difficult to minimize misalignment. As illustrated in FIG. 1A, the mask opening M is off center from the targeted interconnect line $120_B$ and the edge of opening M overlaps a portion of the neighboring interconnect line $120_C$.

Figure 1B:
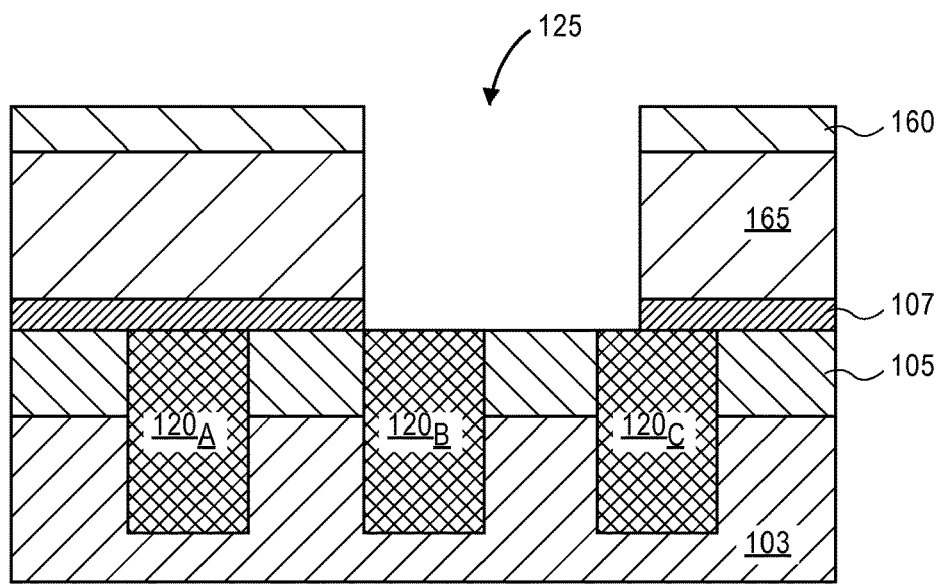
FIG. 1B is a cross-sectional illustration of an interconnect structure after a misaligned via opening has been formed, according to an embodiment.

Referring now to FIG. 1B, the resist material is developed and the second ILD 165 and the etchstop layer 107 are removed with an etching process to form via opening 125. As illustrated, the misaligned mask opening M has resulted in the exposure of a top surface of the targeted interconnect line $120_B$ and a portion of a top surface of the neighboring interconnect line $120_C$. Since both interconnect lines $120_B$ and $120_C$ are exposed, a subsequent metal deposition process will produce an unwanted short-circuit between the two lines. Accordingly, reducing the pitch of the interconnect lines requires aligning and patterning photoresist masks with increased precision that may not be obtainable with conventional lithography processes.

In order to overcome such limitations caused by overlay error, embodiments of the invention include methods for selectively protecting the top surface of neighboring interconnect lines that are exposed due to overlay error. For example, there may be two separate populations of interconnect lines that are formed in an alternating pattern. The different interconnect line populations may be substantially similar to each other with the exception that the top surfaces of the first population of the interconnect lines is a different material than a top surface of the second population of interconnect lines. Accordingly, the differences in the material composition of the top surfaces allow for the interconnect lines to have catalysts or pre-catalysts selectively grafted onto the surface. Embodiments allow the catalyst or pre-catalyst to initiate a localized cross-linking reaction in a spun-on dielectric that is subsequently deposited into the via opening. A low temperature bake is used to ensure that the cross-linking reaction is initiated in only the portion of the dielectric that is proximate to the grafted catalyst agent. The cross-linked dielectric remains behind and functions as an insulating layer that provides protection from shorting to non-targeted interconnect lines during the metal deposition to form the via. Embodiments that include such features are illustrated and described below with respect to FIGS. 2A-2G.

Figure 2A:
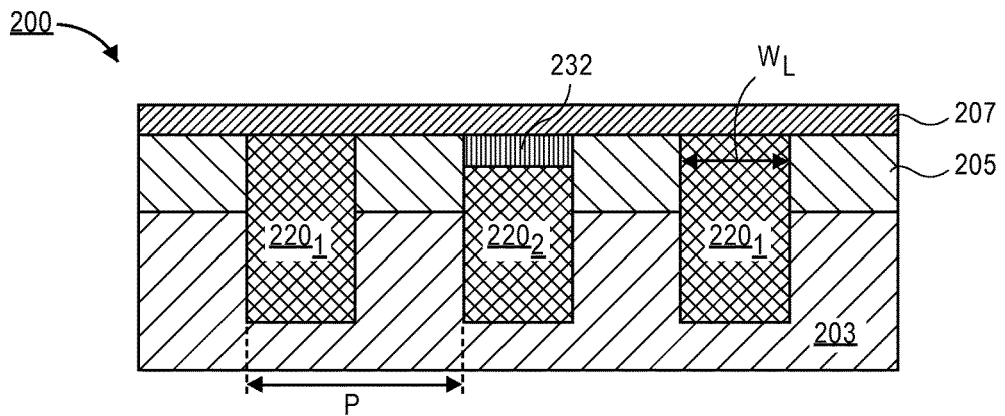
FIG. 2A is a cross-sectional illustration of an interconnect structure that has first and second interconnect lines that have a cap layer formed over a top surface of the second interconnect lines, according to an embodiment.

Referring now to FIG. 2A, a cross-sectional illustration of an interconnect structure 200 is shown according to an embodiment of the invention. The interconnect structure 200 may be used in conjunction with any semiconductor device that utilizes one or more interconnect layers, such as an IC circuit or the like. In an embodiment, the interconnect structure 200 may be one layer in a back-end-of-line (BEOL) stack that includes a plurality of interconnect layers. As such, the interconnect structure 200 may be formed over another interconnect layer. Additional embodiments may include forming the interconnect structure 200 as the first interconnect layer over a semiconductor material on which one or more transistors or other devices are formed. Implementations of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of the present invention.

According to an embodiment, interconnect structure 200 includes an interlayer dielectric (ILD) 203. Embodiments of the invention utilize low-k dielectric materials that are typically known in the art for use as ILDs such as, silicon dioxide. According to embodiments of the invention, low-k dielectric materials suitable for formation of the ILD 203 may also include, but are not limited to, materials such as carbon doped silicon dioxide, porous silicon dioxide, or silicon nitrides. Additional embodiments of the invention may include an ILD 203 formed from dielectric materials with k-values less than 5. Embodiments may also include an ILD with a k-value less than 2. According to additional embodiments, the ILD 203 may include air gaps and have a k-value of 1.

In an embodiment, a first hardmask layer 205 is formed over the top surface of the ILD 203. By way of example, the first hardmask layer 205 may be a dielectric material, such as a nitride or an oxide. According to an embodiment, the first hardmask layer 205 is resistant to an etching process that may be used to etch through a second ILD 265 used for forming interconnects lines above the first hardmask layer 205. Embodiments of the invention include a first hardmask layer 205 that is between 3 nm and 10 nm thick. It is to be appreciated that the hardmask layer 205 is represented as a single material in the Figures, though embodiments are not limited to such configurations. For example, the hardmask 205 may include a stack of one or more different hardmask materials.

The interconnect layer 200 may include a plurality of interconnect lines 220 formed into the ILD 203. According to an embodiment, the interconnect lines 220 may include two populations of interconnect lines (i.e., first interconnect lines $220_1$ and second interconnect lines $220_2$). The first interconnect lines $220_1$ may be formed in an alternating pattern with the second interconnect lines $220_2$. The first and second interconnect lines 220 are formed with conductive materials. By way of example, and not by way of limitation, the conductive materials used to form the interconnect lines may include, Cu, Co, W, NiSi, TiN, Mo, Ni, Ru, Au, Ag, Pt, or the like. In an embodiment, the same conductive material is used to form the first and second interconnect lines 220. According to an alternative embodiment, the first and second interconnect lines 220 are formed with different conductive materials.

The first interconnect lines $220_1$ are spaced apart from the second interconnect lines $220_2$ by a pitch P. Embodiments of the invention include high density interconnect lines with a pitch P less than 60 nm. Further embodiments of the invention include a pitch P that is less than 30 nm. Embodiments of the invention include interconnect line widths $W_L$ less than 30 nm. Additional embodiments of the invention include interconnect line widths $W_L$ less than 15 nm.

According to an embodiment, the first interconnect lines $220_1$ and the second interconnect lines $220_2$ may be substantially similar with the exception that top surfaces of the first interconnect lines $220_1$ may be a different material than the top surfaces of the second interconnect lines $220_2$. In the illustrated embodiment, the top surfaces of the second interconnect lines $220_2$ are covered by a cap layer 232. The cap layer 232 formed over the second interconnect lines $220_2$ allows for differences in material composition to be used to selectively graft a catalyst agent onto one population of the interconnect lines 220. Such a selective grafting process will be described in greater detail below. By way of example, the cap layer 232 may be Cu, W, Ru, Co, Mo, Ni, Pt, Pd, Ta, Ti, RuTa, and their alloys, intermetallics, such as metal nitrides and carbides, such as TaN, TiN, WCN, or germanides and silicides, such as $Cu_3Ge$, $Ni_xSi_y$, or the like.

In an embodiment, the cap layer 232 formed over the second interconnect lines $220_2$ remains in the final structure as a remnant of the processing operations used to form interconnect structure 200. In certain embodiments, the cap layer 232 has a different resistivity than the metal used for the interconnect lines 220. Accordingly, it may be advantageous to minimize the thickness of the cap layer 232. In an embodiment, the thickness of the cap layer 232 may be less than the thickness of the first hardmask layer 205. In a specific embodiment, the thickness of the cap layer 232 may be less than 10 nm. Additional embodiments may include a cap layer 232 that has a thickness less than 5 nm. In an embodiment, an etchstop layer 207 may be formed over the top surfaces of the hardmask 205, the cap 232, and the interconnect lines 220. It is to be appreciated that the etchstop layer 207 is represented as a single material in the Figures, though embodiments are not limited to such configurations. For example, the etchstop layer 207 may include a stack of one or more different etchstop materials.

According to an embodiment of the invention, the interconnect structure 200 may be formed with any suitable processing techniques. In one embodiment, the first interconnect lines $220_1$ and $220_2$ may be patterned using multiple patterning operations, such as self-aligned spacer etching processes. An exemplary process for forming an interconnect structure 200 is described and illustrated below with respect to FIGS. 3A-3H.

Figure 2B:
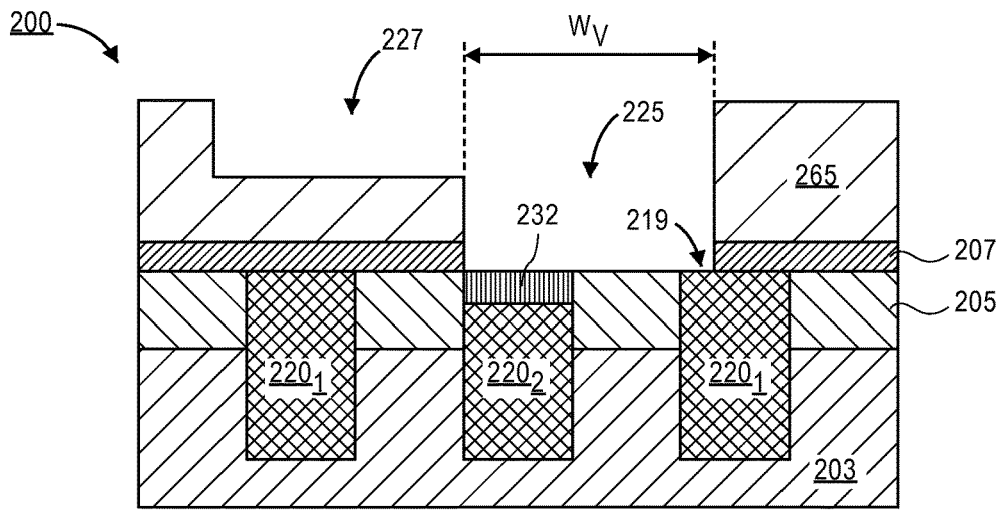
FIG. 2B is a cross-sectional illustration of an interconnect structure that has a via opening and an interconnect line trench formed in a second interlayer dielectric, according to an embodiment.

Referring now to FIG. 2B, an interconnect line trench 227 and a via opening 225 are formed through the ILD layer 265 and the etchstop layer 207. According to an embodiment, the via opening 225 has a width $W_V$ that is greater than the width $W_L$ of the interconnect lines $220_1$ and $220_2$. Due to the width of the via opening 225, misalignment of the via opening 225 may result in the exposure of a top surface of an interconnect line that should not be contacted by the via, and therefore would result in a short circuit, as described above. In the illustrated embodiment, the via opening 225 was intended to expose only the second interconnect line $220_2$. However, the misaligned via opening 225 has resulted in the exposure of a portion of the top surface 219 of the neighboring first interconnect line $220_1$. Since embodiments of the present invention allow for neighboring interconnect lines to be protected from shorting even when exposed by error due to misalignment of the via, embodiments of the invention are able to utilize large via openings 225. For example, the width $W_V$ of the via opening 225 may be greater than the pitch P. In an embodiment, the width $W_V$ of the via opening 225 may be greater than the twice the pitch P. Increasing the width $W_V$ of the via opening 225 allows for the limitations of photolithography patterning processes, materials, and equipment, such as those described above, to be avoided.

In order to prevent the top surface 219 of the neighboring first interconnect line $220_1$ from being contacted by the via that will be formed in the via opening 225, embodiments of the invention selectively form an isolation layer over the exposed top surface 219. The differences in the material compositions of the top surfaces of the first interconnect lines $220_1$ and the second interconnect lines $220_2$ due to the presence of the caps 232 allows for selective grafting of catalysts or pre-catalysts onto one of the interconnect lines.

Figure 2C:
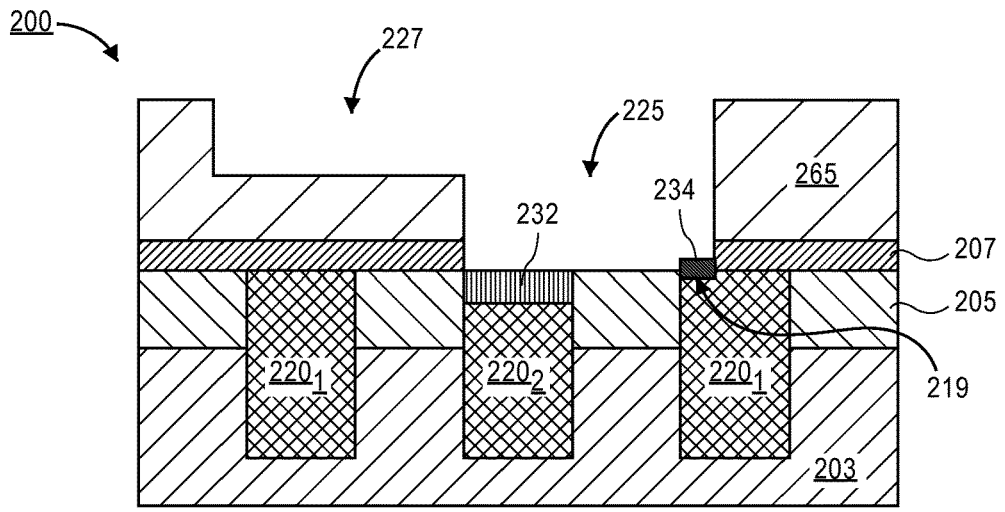
FIG. 2C is a cross-sectional illustration of an interconnect structure that has a catalyst material selectively formed on a top surface of an exposed second interconnect line, according to an embodiment.

Referring now to FIG. 2C, an interconnect structure that has a catalyst agent 234 selectively grafted onto the top surface 219 of the first interconnect line $220_1$ is shown. According to an embodiment, the catalyst agent 234 is a compound that may enact a cross-linking reaction in a subsequently deposited dielectric layer. Selectively grafting the catalyst agent onto the top surface 219 of the first interconnect line $220_1$ allows for the subsequent cross-linking reaction to be localized to the region surrounding the top surface 219 of the interconnect line $220_1$. The presence of a catalyst agent 234 allows for the cross-linking reaction to occur at a low temperature that will not result in the cross-linking reaction being initiated in locations where the catalyst agent is not present. According to an embodiment, the catalyst agent 234 may be a catalyst or a pre-catalyst. As used herein, reference to a "catalyst" is also understood to include "pre-catalysts". By way of example, the catalyst may include an acid or a base. For example, acid catalysts may include strong Bronsted acids, such as trifluoromethanesulfonic acid, strong Lewis acids, such as tris-pentafluorophenylborane, or the like. For example, bases used for a catalysts may include trialkylamines, pyridines, or the like. The particular catalyst that is chosen is dependent on the dielectric material used.

As illustrated, the catalyst agent 234 is formed over the exposed portions of the top surface 219 of the first interconnect line $220_1$. It is to be appreciated that the extent of the misalignment of the via opening 225 contributes to the percentage of the top surface 219 that is covered by the catalyst agent 234. For example, the entire top surface 219 of the first interconnect line $220_1$ may be exposed if a sidewall of the via opening 225 (i.e., the rightmost sidewall in FIG. 2C) is formed to the right of the first interconnect line $220_1$. Additional embodiments may include the via opening 225 exposing portions of the top surface 219 of the neighboring first interconnect lines $220_1$ on both sides of the second interconnect line $220_2$. In such an embodiment, the catalyst agent 234 may be selectively grafted onto the top surfaces 219 of more than one first interconnect line $220_1$.

In one embodiment, the catalyst agent 234 may be selectively grafted onto the exposed top surface 219 of the first interconnect line 220 with a direct adsorption process. In such an embodiment, the catalyst agent 234 is coated directly onto the exposed surfaces in the via opening 225. The catalyst agent 234 may be strongly held to the desired surfaces as a result of hydrogen bonding or other electrostatic interactions that are preferentially initiated at the exposed top surface 219 of the first interconnect line 220. For example, a silicon surface may react with a strong Lewis acid, such as $B(C_6F_5)_3$, to form $Si-O-B(C_6F_5)_3H^+$. Such a catalyst agent 234 will readily initiate a cross-linking reaction in certain spun on dielectrics when a low temperature bake is performed. Furthermore, embodiments may control the rate of diffusion of the catalyst agent 234 by controlling the size of the molecule of the catalyst agent 234. Limiting the diffusion of the catalyst agent 234 ensures that the cross-linking reaction only occurs proximate to the exposed top surface 219 of the first interconnect line $220_1$. For example, $Si-O-B(C_6F_5)_3H^+$ may be considered a relatively large molecule that has a low diffusion rate, and therefore, helps localize the cross-linking reaction.

In an additional embodiment of the invention, the catalyst agent 234 may use covalent adhesion to attach to the top surface 219 of the first interconnect line $220_1$. For example, the catalyst agent 234 may be linked to a grafting group (not shown), and the grafting group is selectively grafted to one of the exposed materials in the via opening 225. In an embodiment, the grafting group may include silane chemistries. By way of example, and not by way of limitation, the silane chemistries may include chloro-, alkoxy-, or aminosilanes. Additional embodiments may also include grafting groups such as siloxanes, silyl chlorides, alkenes, alkynes, amines, phosphines, thiols, phosphonic acids, carboxylic acids, or the like. In one embodiment, a catalyst agent 234 that is covalently linked to a grafting group may include an acid generator (e.g., a photo-acid generator or a thermal-acid generator) that is based on onium salts that is attached to a siloxane. In a specific example, the siloxane may be $[(MeO)_3Si-CH_2CH_2CH_2SR_2][X]$, where R is an alkyl or aryl group, and X is a weakly coordinating anion, such as triflate, nonaflate, $H-B(C_6F_5)_3$, $BF_4$, or the like. In embodiments that utilize catalyst agents 234 that are linked to a grafting group, the catalyst agent 234 may be selectively formed over one material in several different ways. In a first process, the grafting group may be selectively formed over the desired surface, such as the top surface 219 of the first interconnect line $220_1$. In such an embodiment, the grafting group will be chosen such that the grafting group preferentially attaches to the top surface 219 of the first interconnect line 220 and the top surfaces of the cap 232 and the hardmask 205 do not react with the grafting group. Alternatively, the grafting group may initially be grafted to all surfaces at the bottom of the via opening 225 (i.e., the cap 232, the hardmask 205, and the top surface 219 of the first interconnect line $220_1$) and then be selectively removed from the cap 232 and the hardmask 205 with thermal, dry etch, or wet etch processes.

Figure 2D:
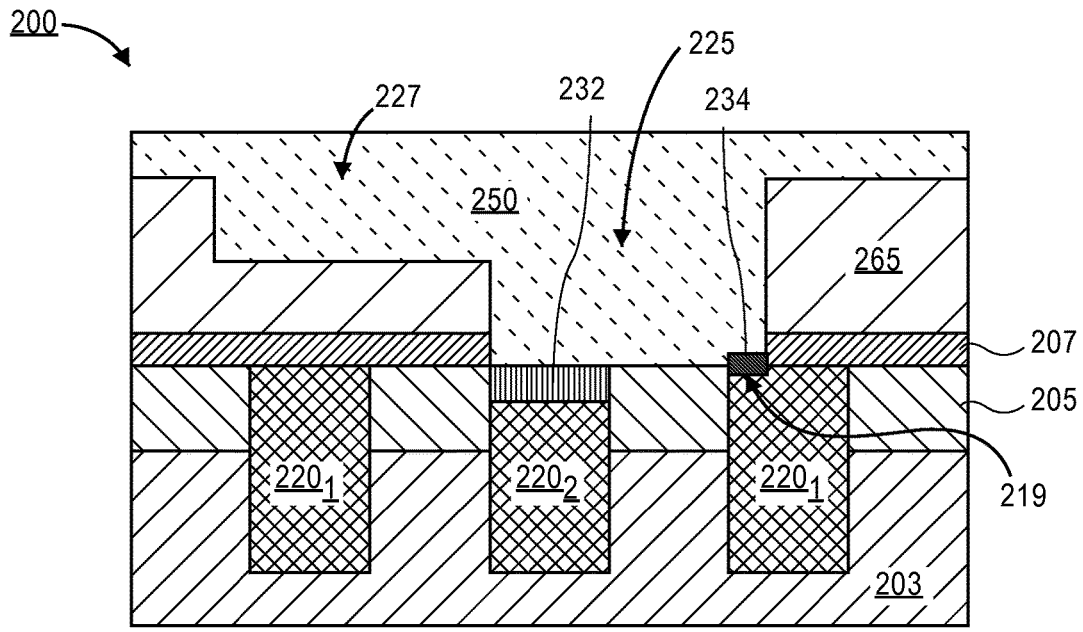
FIG. 2D is a cross-sectional illustration of an interconnect structure that has a spun-on dielectric filling the via opening and the interconnect line trench, according to an embodiment.

Referring now to FIG. 2D, a dielectric material 250 is deposited into the via opening 225 and the interconnect line trench 227. According to an embodiment the dielectric material 250 may be a spun-on dielectric material 250. The dielectric material 250 may be a material that is cross-linkable. For example, when sufficient activation energy is provided to the dielectric material 250, the cross-linking reaction will be initiated. The cross-linking reaction may result in a solubility switch in the dielectric material 250. For example, cross-linked portions of the dielectric material 250 may not be soluble in a particular solvent that will remove the non-cross-linked portions of the dielectric material. According to an embodiment of the invention, the activation energy required to initiate the cross-linking reaction in the dielectric material 250 may be decreased in the presence of catalyst agent 234. For example, the presence of the catalyst agent 234 may decrease the temperature needed for initiating the cross-linking reaction in the dielectric material 250 to between approximately 100° C. and 300° C. According to an embodiment of the invention, the dielectric material may be a spin-on dielectric, such as one based on 1,3,5-trisilacyclohexane, silsesquioxanes, cyclotetrasiloxanes, or other alkylsiloxanes or carbosilanes.

Figure 2E:
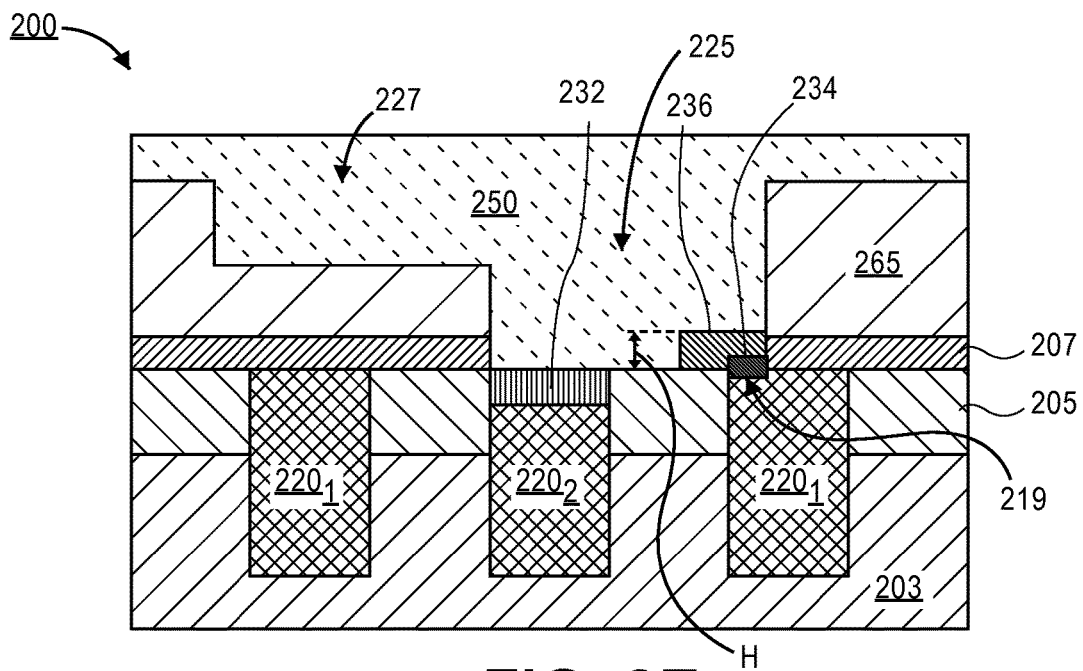
FIG. 2E is a cross-sectional illustration of an interconnect structure after the catalyst material is diffused into the spun-on dielectric and a cross-linking reaction has been initiated, according to an embodiment.

Referring now to FIG. 2E, the cross-linking reaction in the dielectric material has been activated and an isolation layer 236 is formed over the top surface 219 of the first interconnect line $220_1$. According to an embodiment, the cross-linking reaction that forms cross-linked dielectric material of the isolation layer 236 is localized to the region proximate to the catalyst agent 234. As described above, the cross-linking reaction may be isolated to the region proximate to the catalyst agent by implementing a low-temperature bake. It is to be appreciated that the time and temperatures used for the bake are controlled so that the cross-linking remains proximate to the top surface 219 of the first interconnect line 220₁. For example, longer bake times may allow for the catalyst agents 234 to diffuse away from the top surface 219 of the first interconnect line 220₁. According to an embodiment, the isolation layer 236 may extend up from the top surface 219 of the first interconnect line 220₁ a height H. By way of example, the height H may be approximately equal to or less than half of the pitch P between neighboring interconnect lines 220. Additionally, embodiments of the invention may include the isolation layer 236 extending over the hardmask 205. For example, the isolation layer 236 may extend across the hardmask 205. In one embodiment, the isolation layer 236 may extend approximately half the distance to the neighboring second interconnect line 220₂. According to an embodiment, the desired proximity of the cross-linking reaction to the top surface 219 of the first interconnect line 220₁ may be obtained with a bake between approximately 100° C. and 300° C. and for between approximately thirty seconds and three minutes.

Figure 2F:
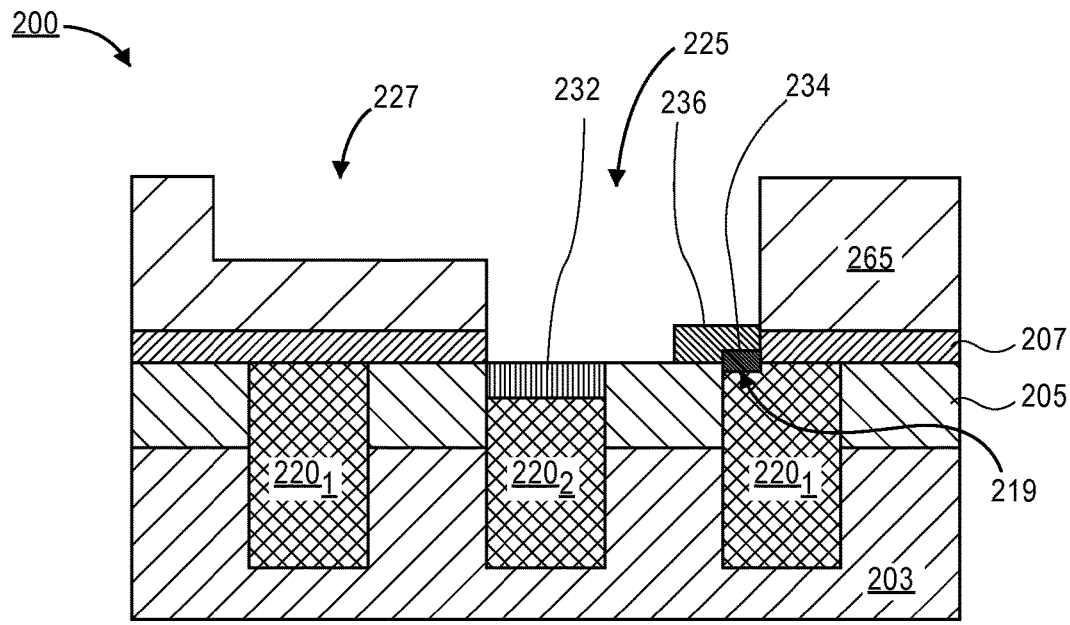
FIG. 2F is a cross-sectional illustration of an interconnect structure after the non-cross-linked portions of the dielectric material are removed from the via opening and the interconnect line trench, according to an embodiment.

Referring now to FIG. 2F, the portions of the dielectric material 250 that are not cross-linked may be removed from the via opening 225 and the interconnect line trench 227. According to an embodiment, the portions of the dielectric material 250 that are not cross-linked may be removed with a suitable solvent, etching process, or ashing process. For example, the cross-linked dielectric material of the isolation layer 236 may have undergone a solubility switch that renders the cross-linked dielectric material of the isolation layer 236 non-dissolvable by a solvent that will remove the portions of the dielectric material 250 that are not cross-linked. After the removal of the portions of the dielectric material 250 that are not cross-linked, embodiments of the invention may further comprise a second bake. The second bake may be implemented at a higher temperature than the first bake to increase the cross-linking within isolation layer 236. For example, the second bake may be performed at a temperature that is greater than approximately 300° C.

Figure 2G:
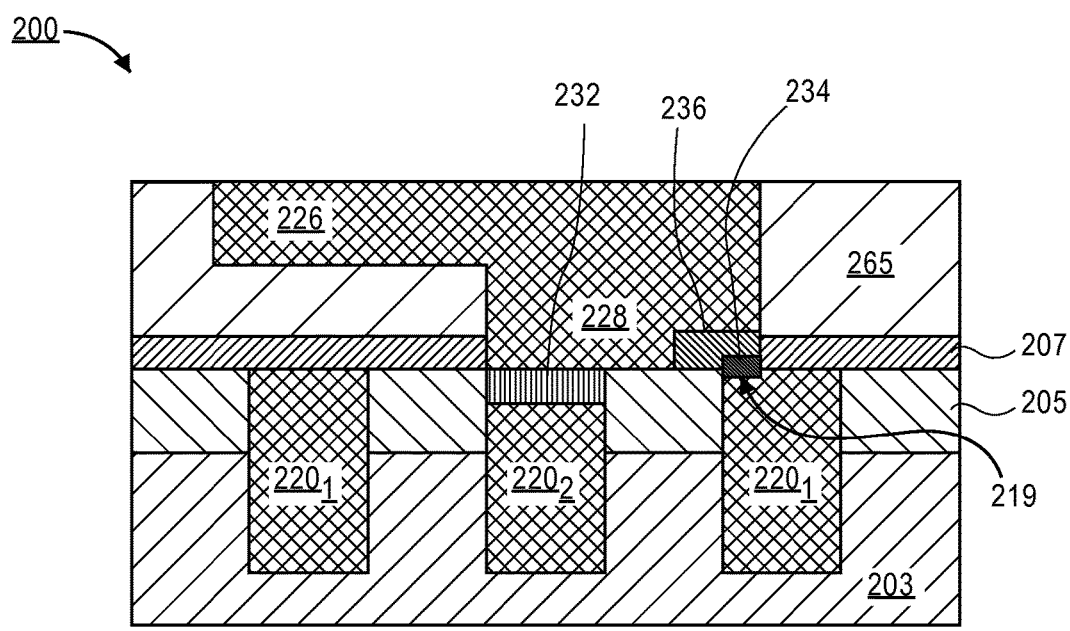
FIG. 2G is a cross-sectional illustration of an interconnect structure after the via and the interconnect line have been formed in the second interlayer dielectric, according to an embodiment.

Referring now to FIG. 2G, a via 228 and an interconnect line 226 are formed in the via opening 225 and the interconnect line trench 227, respectively. According to an embodiment, the via 228 and the interconnect line 226 may be any suitable conductive material, stacks of conductive materials, and/or conductive alloys. By way of example, the via 228 and the interconnect line 226 may include Ag, Au, Co, Cu, Mo, Ni, NiSi, Pt, Ru, TiN, W, or the like. Embodiments of the invention include depositing the via 228 and the interconnect line 226 with any suitable deposition process, such as physical vapor deposition (PVD), chemical vapor deposition (CVD), atomic layer deposition (ALD), electroplating, electroless plating, or the like. Overburden from the deposition of the conductive material may then be recessed, (e.g., with a polishing process) to ensure that a top surface of the interconnect line 226 is substantially planar with a top surface of the second ILD 265.

As illustrated, the via 228 is prevented from contacting the first interconnect line 220₁ by the isolation layer 236. Therefore, even though the edge of the via opening 225 was misaligned and exposed the wrong interconnect line, a short between neighboring interconnects lines was mitigated. Embodiments of the invention, therefore, may include a finished interconnect structure that includes one or more vias 228 that contact a second interconnect line 220₂ (or the cap 232 over the second interconnect line 220₂) and an isolation layer 236 formed over one or more neighboring first interconnect lines 220₁. As illustrated in FIG. 2G, the isolation layer 236 separates the bottom surface of the via 228 from the top surface of the first interconnect line 220₁. Additionally, a sidewall of the isolation layer 236 may be in contact with (and substantially coplanar to) a sidewall of the etch-stop layer 207 and a sidewall of the second ILD 265. While the embodiment illustrated in FIG. 2G includes the cap 232 in the final structure, it is to be appreciated that the cap 232 may be omitted. For example, the cap 232 may be removed with an etching process after the isolation layer 236 has been formed and prior to depositing the via 228 and the interconnect line 226. Additionally, it is to be appreciated that in some embodiments the catalyst agent 234 may not be perceptible in the finished structure because the catalyst has been consumed during the cross-linking reaction.

While the description and illustrations in FIGS. 2A-2G illustrate the selective formation of an isolation layer 236 over the first interconnect lines 220₁, it is to be appreciated that substantially the same processes may be repeated in a second via formation process in order to form a second isolation layer 236 over the second interconnect lines 220₂. In such an embodiment, a second catalyst agent 234 may be used that is selectively grafted onto exposed portions of the cap 232 that is formed over the second interconnect lines 220₂.

Embodiments of the invention utilize two populations of interconnect lines formed in an alternating pattern. In order to selectively graft the catalyst agent onto one population, the top surfaces of the interconnect lines need to be different from each other. As described above, the difference between the first and second interconnect line populations may be realized by forming a cap over one population of the interconnect lines. Accordingly, FIGS. 3A-3H provide cross-sectional illustrations of an exemplary processing procedure that may be used to form two populations of interconnect lines formed in an alternating pattern.

Figure 3A:
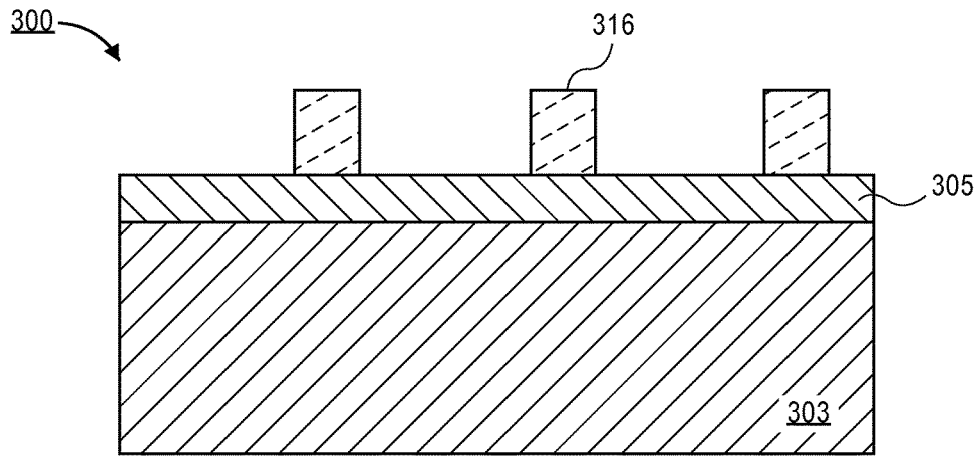
FIG. 3A is a cross-sectional illustration of an interconnect structure that has a backbone layer formed over a hardmask layer, according to an embodiment.

Referring now to FIG. 3A, an ILD layer 303 is shown. By way of example, the ILD layer 303 may be any ILD material known in the art, such as carbon doped silicon dioxide, porous silicon dioxide, or silicon nitrides. According to an embodiment, a hardmask layer 305, such as a nitride or an oxide material, may be formed over the ILD layer 303. According to embodiments, ILD 303 may be formed over one or more additional interconnect structures (not shown), or ILD 303 may be formed over a device substrate, such as a semiconducting substrate on which electrical circuitry is formed (not shown).

A backbone layer 316 may be formed above the hardmask layer 305. The backbone 316 may be any material suitable for the formation of a hardmask layer, such as amorphous silicon, polysilicon, amorphous carbon, silicon nitride, silicon carbide, germanium, or the like. The backbone 316 may be patterned with any conventional patterning process, such as photolithography or the like. In a specific embodiment, the backbone 316 may be formed with a multiple-patterning process in order to obtain a desired pitch.

Figure 3B:
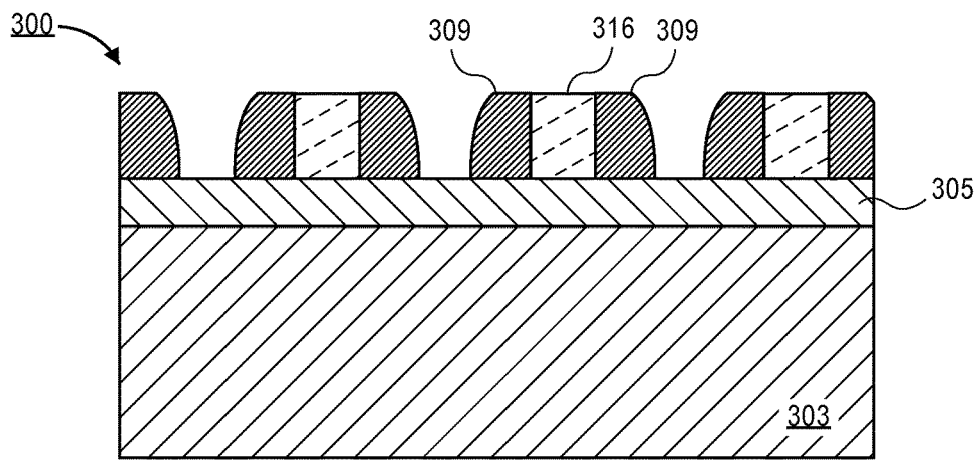
FIG. 3B is a cross-sectional illustration of an interconnect structure after spacers are formed along sidewalls of the backbone layer, according to an embodiment.

Referring now to FIG. 3B, spacers 309 may be formed along the sidewalls of the backbone 316. A spacer formation deposition and etching process may be used to form the spacers 309. For example, a conformal layer of spacer material may be blanket deposited over the surfaces of the backbone 316 and the first hardmask layer 305. After the blanket deposition, a spacer forming etch may be implemented. Embodiments include an anisotropic dry etching process that selectively removes the portions of the deposited layer that are formed on horizontal surfaces, thereby leaving spacers 309 along the sidewalls of the backbone 316. According to an embodiment, the spacers 309 may be a conformal material, such as, but not limited to, $SiO_2$, SiN, $HfO_2$, TiO, ZrO, AlN, AlO, and combinations thereof.

According to an embodiment of the invention, the material used to form the backbone 316 may have a high etch selectivity over the material used to form the spacers 309 during a given etching process. According to such embodiments, the spacers 309 are resistant to an etching process that will readily etch away the backbone 316. By way of example, when the backbone 316 is made from an amorphous silicon, then the spacers 309 may be made with titanium oxide.

Figure 3C:
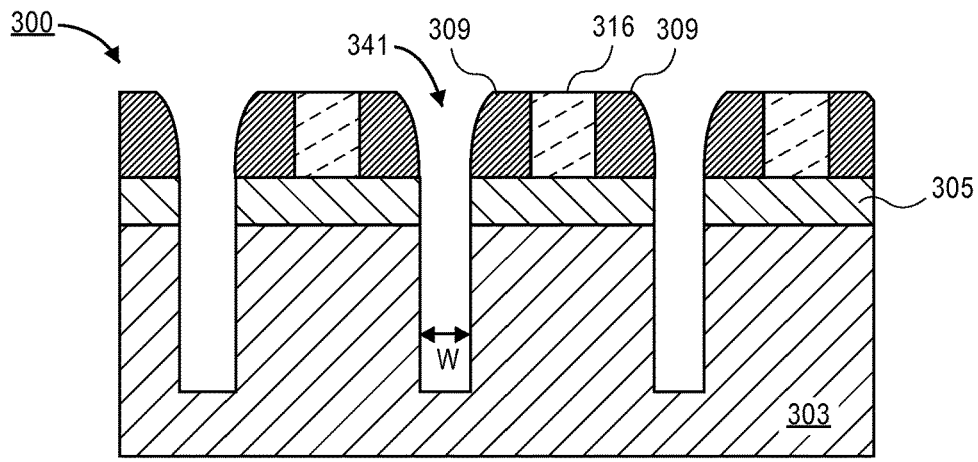
FIG. 3C is a cross-sectional illustration of an interconnect structure after first trenches are formed through the hardmask layer and into the interlayer dielectric below the hardmask layer, according to an embodiment.

Referring now to FIG. 3C, a first trench etching process is used to form first trenches 341 through the hardmask layer 305 and into the ILD 303. The first trench etching process utilizes the spacers 309 as a mask in order to provide the proper spacing between the first trenches 341 and to form the first trenches 341 with the desired width W. According to an embodiment of the invention, the width W is less than approximately 30 nm. An additional embodiment of the invention includes a width W that is less than 15 nm. In an embodiment, the first trenches 341 may have a depth between approximately 20 nm and approximately 60 nm. Additional embodiments of the invention include forming the first trenches 341 to a depth of approximately 40 nm.

Figure 3D:
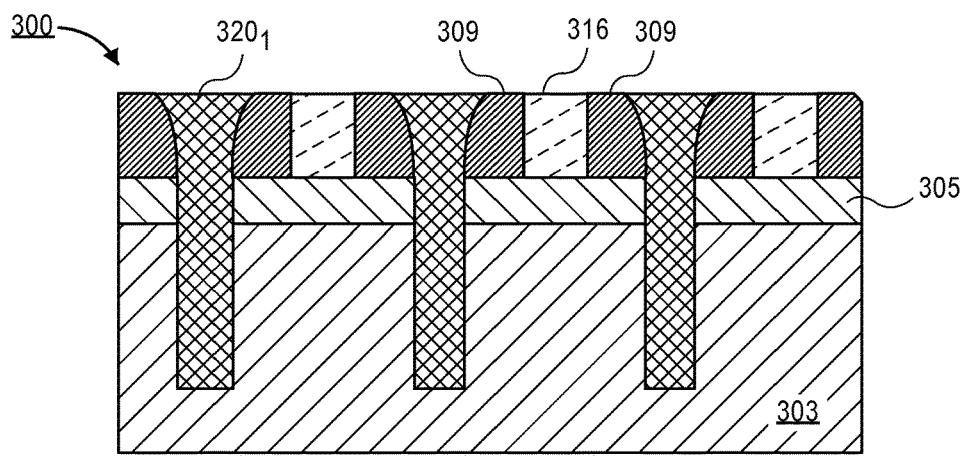
FIG. 3D is a cross-sectional illustration of an interconnect structure after the first trenches are filled with a conductive material to form first interconnect lines, according to an embodiment.

Referring now to FIG. 3D, a conductive layer may be formed in the first trenches 341 to form the first interconnect lines $320_1$, according to an embodiment. Embodiments of the invention include first interconnect lines $320_1$ that are formed with a conductive material that may be any conductive metal used for interconnect lines, such as Ag, Au, Co, Cu, Mo, Ni, NiSi, Pt, Ru, TiN, W, or the like. Embodiments of the invention include depositing the interconnect lines $320_1$ with any suitable deposition process, such as PVD, CVD, ALD, electroplating, electroless plating, or the like. According to an embodiment, the top surfaces of the first interconnect lines $320_1$ may be planarized with the top surfaces of the spacers 309 in order to remove overflow material from the metal deposition. According to an embodiment, the planarization may be performed with a process such as chemical-mechanical planarization (CMP) or an etching process.

Figure 3E:
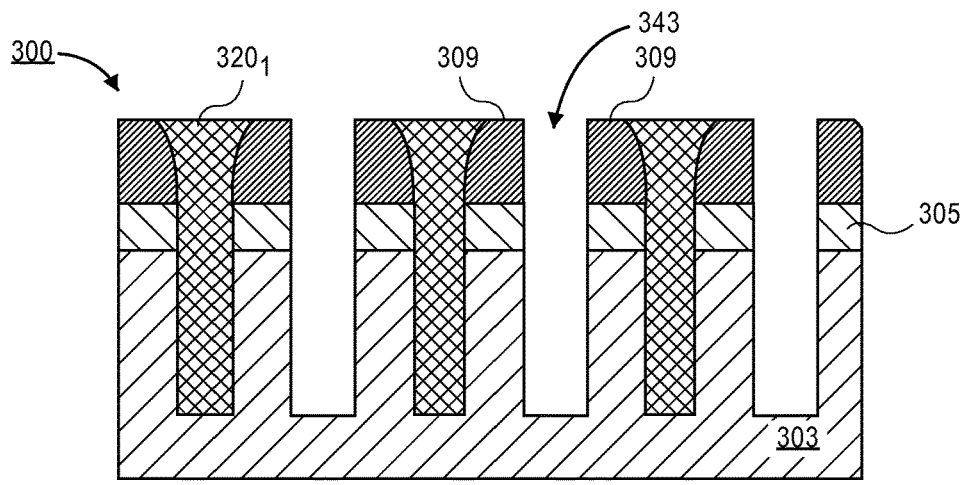
FIG. 3E is a cross-sectional illustration of an interconnect structure after the backbone layer is removed and second trenches are formed through the hardmask layer and into the interlayer dielectric below the hardmask layer, according to an embodiment.

Referring now to FIG. 3E, the backbone 316 is etched away and second trenches 343 may be formed into the ILD 303. According to an embodiment, the remaining portions of the spacers 309 provide a masking layer for use in etching second trenches 343. According to an embodiment, the depth of the second trenches 343 may be substantially similar to the depth of the first trenches 341. According to alternative embodiments, the depth of the second trenches 343 may be greater than or less than the depth of the first trenches 341.

Figure 3F:
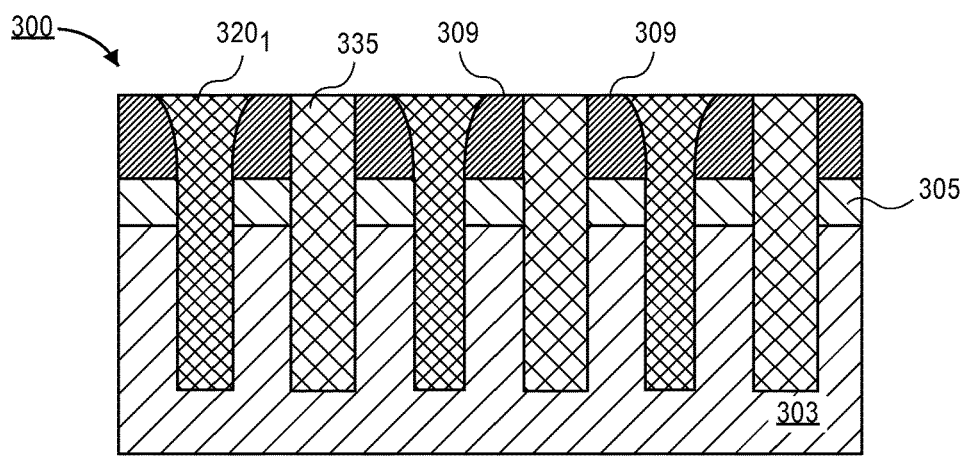
FIG. 3F is a cross-sectional illustration of an interconnect structure after the second trenches are filled with a sacrificial fill material, according to an embodiment.

Referring now to FIG. 3F, a hardmask material 335 is deposited into the second trenches 343. In an embodiment, any overburden from the deposition process may be removed, for example with a CMP process or with an etching process.

Figure 3G:
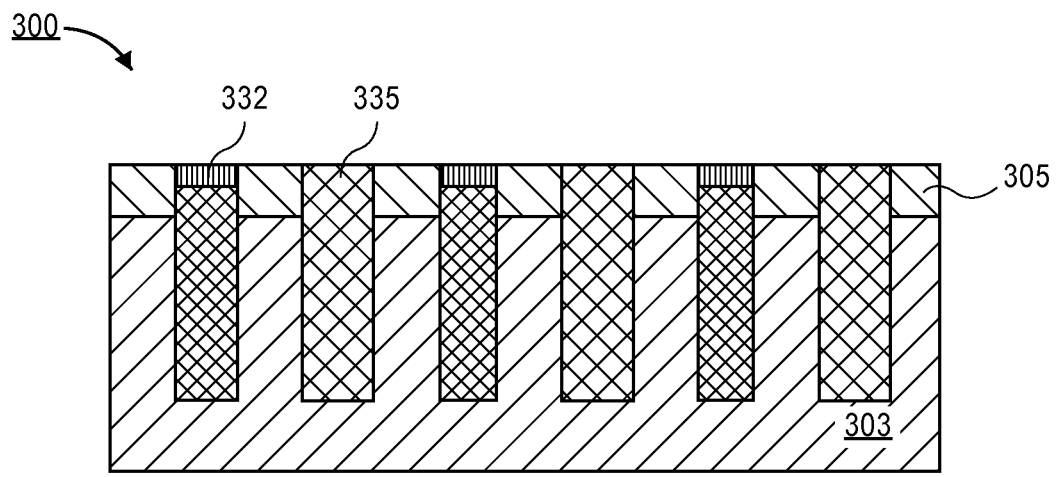
FIG. 3G is a cross-sectional illustration of an interconnect structure after the structure has been polished back to remove the spacers, and the first interconnect lines are recessed and covered by a cap layer, according to an embodiment.

Referring now to FIG. 3G, the interconnect structure is polished back to remove the spacers 309. For example, the polishing process may be a CMP process. During the polishing process, first interconnect lines $320_1$ are recessed and a cap 332 is formed over their top surfaces. By way of example, the metallic material may be selectively recessed with an etching process or by increasing the chemical portion of a chemical mechanical polishing operation. The cap 332 may be a conductive material that is used to differentiate the surface of the first interconnect lines $320_1$ from the surface of the second interconnect lines $320_2$ that will be formed in a subsequent processing operation. The cap layer 332 formed over the first interconnect lines $320_1$ allows for differences in material composition to be used to selectively graft a catalyst agent onto one population of the interconnect lines 320. By way of example, the cap layer 332 may be Cu, W, Ru, Co, Mo, Ni, Pt, Pd, Ta, Ti, RuTa, and their alloys, intermetallics, such as metal nitrides and carbides, such as TaN, TiN, WCN, or germanides and silicides, such as $Cu_3Ge$, $Ni_xSi_y$, or the like.

Figure 3H:
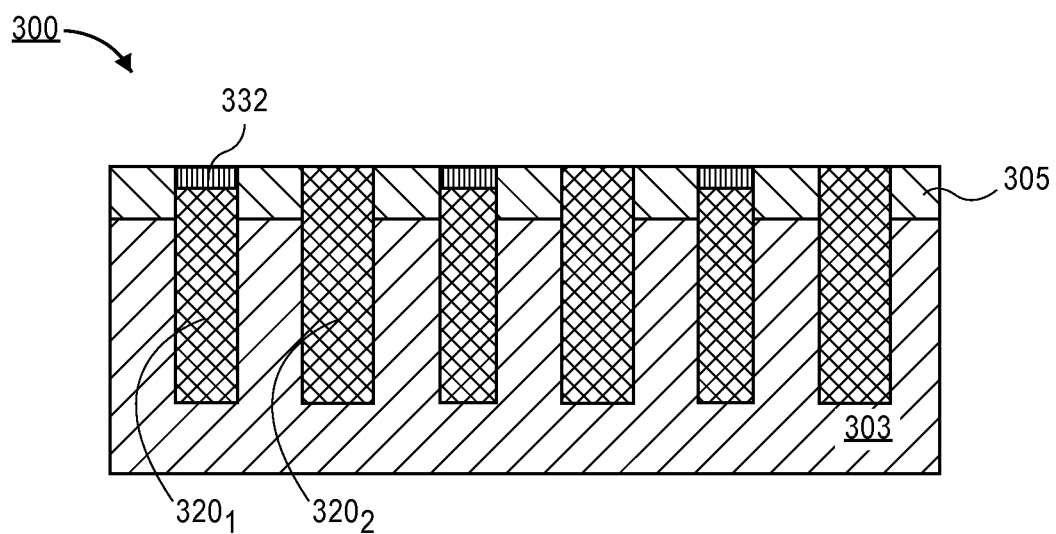
FIG. 3H is a cross-sectional illustration of an interconnect structure after the sacrificial fill material is removed from the second trenches and the second trenches are refilled with a conductive material to form second interconnect lines, according to an embodiment.

Referring now to FIG. 3H, the hardmask 335 is removed. For example, the hardmask 335 may be removed with an ashing process. Additionally, the second trenches 343 are filled with a conductive material and any overburden may be polished back to form the second interconnects $320_2$. In an embodiment, the conductive material may be the same conductive material used to form the first interconnects $320_2$. In an additional embodiment, the conductive material may not be the same metal used for the first interconnects $320_1$. By way of example, the conductive material may be any metal typically used for interconnect lines, such as Ag, Au, Co, Cu, Mo, Ni, NiSi, Pt, Ru, TiN, W, or the like. Embodiments of the invention include depositing the second interconnect line $320_2$ with any suitable deposition process, such as PVD, CVD, ALD, electroplating, electroless plating, or the like.

Figure 4:
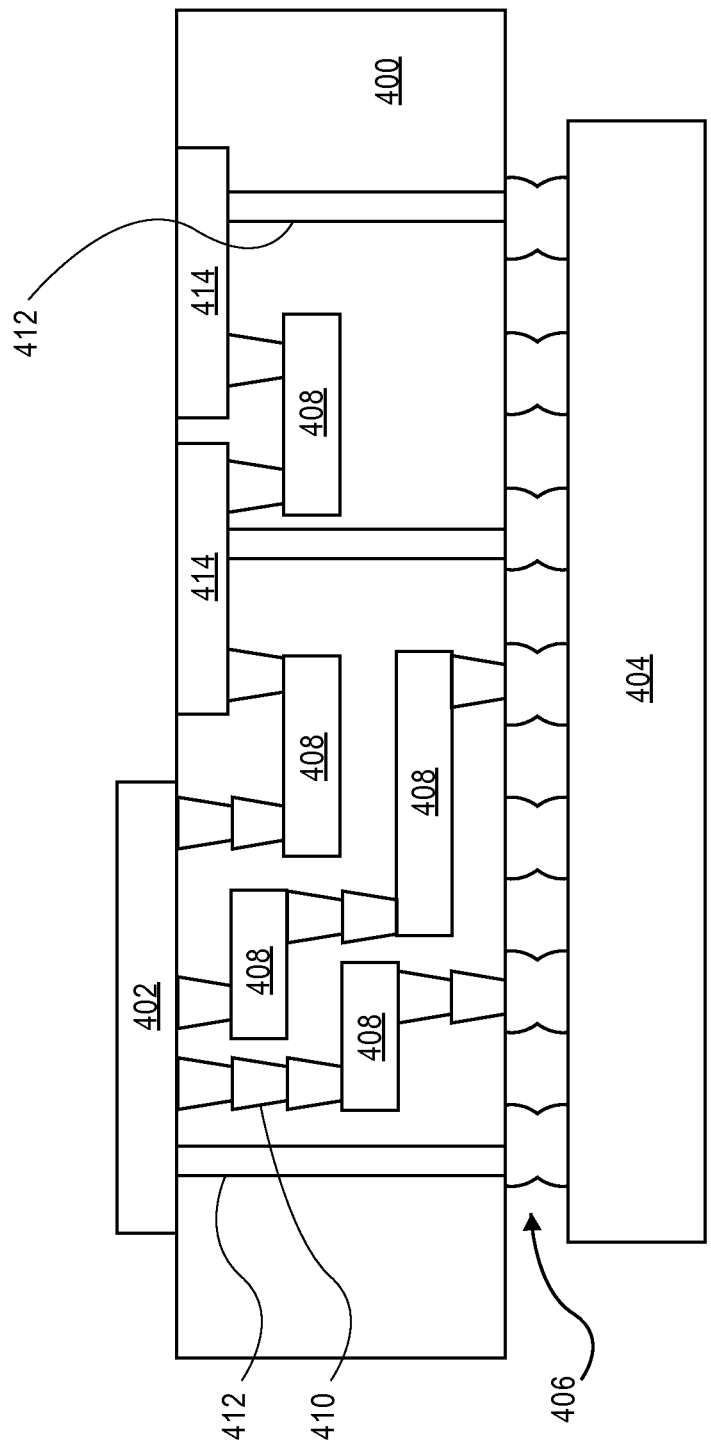
FIG. 4 is a cross-sectional illustration of an interposer implementing one or more embodiments of the invention.

FIG. 4 illustrates an interposer 400 that includes one or more embodiments of the invention. The interposer 400 is an intervening substrate used to bridge a first substrate 402 to a second substrate 404. The first substrate 402 may be, for instance, an integrated circuit die. The second substrate 404 may be, for instance, a memory module, a computer motherboard, or another integrated circuit die. Generally, the purpose of an interposer 400 is to spread a connection to a wider pitch or to reroute a connection to a different connection. For example, an interposer 400 may couple an integrated circuit die to a ball grid array (BGA) 406 that can subsequently be coupled to the second substrate 404. In some embodiments, the first and second substrates 402/404 are attached to opposing sides of the interposer 400. In other embodiments, the first and second substrates 402/404 are attached to the same side of the interposer 400. And in further embodiments, three or more substrates are interconnected by way of the interposer 400.

The interposer 400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 408 and vias 410, including but not limited to through-silicon vias (TSVs) 412. The interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 400.

In accordance with embodiments of the invention, apparatuses that include vias that contact a first interconnect line and a cross-linked dielectric formed over at least a portion of a neighboring interconnect line or processes for forming such devices disclosed herein may be used in the fabrication of interposer 400.

Figure 5:
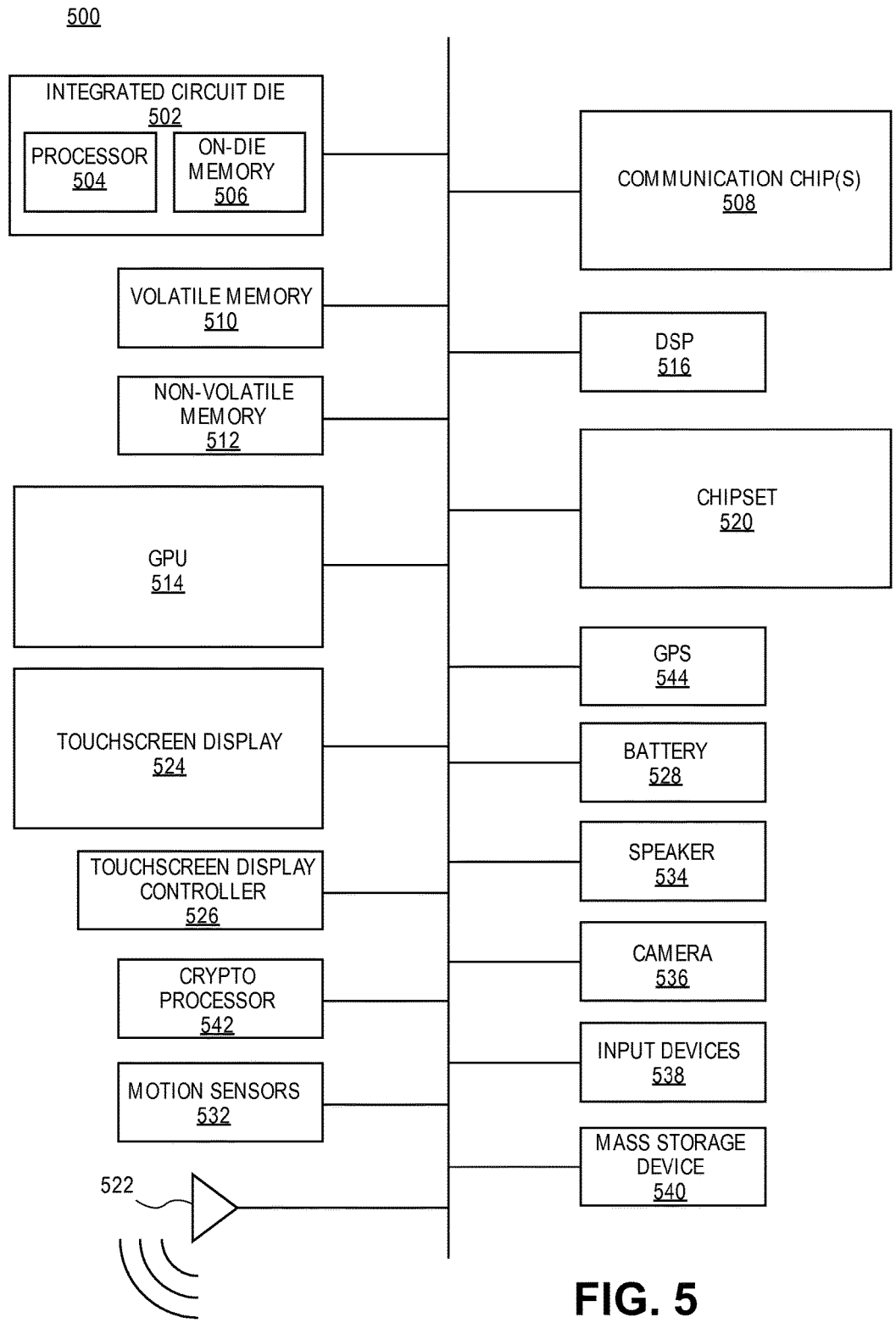
FIG. 5 is a schematic of a computing device built in accordance with an embodiment of the invention.

FIG. 5 illustrates a computing device 500 in accordance with one embodiment of the invention. The computing device 500 may include a number of components. In one embodiment, these components are attached to one or more motherboards. In an alternate embodiment, these components are fabricated onto a single system-on-a-chip (SoC) die rather than a motherboard. The components in the computing device 500 include, but are not limited to, an integrated circuit die 502 and at least one communication chip 508. In some implementations the communication chip 508 is fabricated as part of the integrated circuit die 502. The integrated circuit die 502 may include a CPU 504 as well as on-die memory 506, often used as cache memory, that can be provided by technologies such as embedded DRAM (eDRAM) or spin-transfer torque memory (STTM or STTM-RAM).

Computing device 500 may include other components that may or may not be physically and electrically coupled to the motherboard or fabricated within an SoC die. These other components include, but are not limited to, volatile memory 510 (e.g., DRAM), non-volatile memory 512 (e.g., ROM or flash memory), a graphics processing unit 514 (GPU), a digital signal processor 516, a crypto processor 542 (a specialized processor that executes cryptographic algorithms within hardware), a chipset 520, an antenna 522, a display or a touchscreen display 524, a touchscreen controller 526, a battery 528 or other power source, a power amplifier (not shown), a global positioning system (GPS) device 528, a compass 530, a motion coprocessor or sensors 532 (that may include an accelerometer, a gyroscope, and a compass), a speaker 534, a camera 536, user input devices 538 (such as a keyboard, mouse, stylus, and touchpad), and a mass storage device 540 (such as hard disk drive, compact disk (CD), digital versatile disk (DVD), and so forth).

The communications chip 508 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 508. For instance, a first communication chip 508 may be dedicated to shorter range wireless communications such as Wi-Fi and Bluetooth and a second communication chip 508 may be dedicated to longer range wireless communications such as GPS, EDGE, GPRS, CDMA, WiMAX, LTE, Ev-DO, and others.

The processor 504 of the computing device 500 includes one or more devices, such as transistors that are coupled to one or more vias that contact a first interconnect line and a cross-linked dielectric formed over at least a portion of a neighboring interconnect line, according to an embodiment of the invention. The term "processor" may refer to any device or portion of a device that processes electronic data from registers and/or memory to transform that electronic data into other electronic data that may be stored in registers and/or memory.

The communication chip 508 may also include one or more devices, such as transistors that include vias that contact a first interconnect line and a cross-linked dielectric formed over at least a portion of a neighboring interconnect line, according to an embodiment of the invention.

In further embodiments, another component housed within the computing device 500 may contain one or more devices, such as transistors that include vias that contact a first interconnect line and a cross-linked dielectric formed over at least a portion of a neighboring interconnect line, according to an embodiment of the invention.

In various embodiments, the computing device 500 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Embodiments of the invention include an interconnect structure comprising: a first interlayer dielectric (ILD); a first interconnect line extending into the first ILD; a second interconnect line extending into the first ILD; a second ILD positioned over the first interconnect line and the second interconnect line; a via extending through the second ILD and electrically coupled to the first interconnect line, wherein a portion of a bottom surface of the via is positioned over the second interconnect line; and an isolation layer positioned between the bottom surface of the via and a top surface of the second interconnect line.

Additional embodiments of the invention include an interconnect structure, wherein a cap is formed over the first interconnect line, and wherein the cap is a different material than the second interconnect line.

Additional embodiments of the invention include an interconnect structure, wherein the cap is a metal, an alloy, an intermetallic, a germanide, or a silicide.

Additional embodiments of the invention include an interconnect structure, wherein the cap is Cu, W, Ru, Co, Mo, Ni, Pt, Pd, Ta, Ti, RuTa, TaN, TiN, WCN, $Cu_3Ge$, or $Ni_xSi_y$.

Additional embodiments of the invention include an interconnect structure, wherein a cap is formed over the second interconnect line, and wherein the cap is a different material than the first interconnect line.

Additional embodiments of the invention include an interconnect structure, wherein a bottom surface of the isolation layer contacts a top surface of the hardmask.

Additional embodiments of the invention include an interconnect structure, wherein the isolation layer has a thickness that is approximately half of a pitch between the first interconnect line and the second interconnect line.

Additional embodiments of the invention include an interconnect structure, wherein the first interconnect line is a different material than the second interconnect line.

Additional embodiments of the invention include an interconnect structure, wherein the isolation layer does not extend across the entire width of the top surface of the second interconnect line.

Additional embodiments of the invention include an interconnect structure, wherein the isolation layer is a cross-linked dielectric layer.

Additional embodiments of the invention include an interconnect structure, wherein the isolation layer is based on 1,3,5-trisilacyclohexane.

Additional embodiments of the invention include an interconnect structure, wherein a grafting group is formed between the bottom surface of the isolation layer and a top surface of the second interconnect line.

Embodiments of the invention include a method of forming a via, comprising: forming a via opening through a second interlayer dielectric (ILD) formed over a top surface of a first interconnect layer that comprises: a first ILD with a hardmask positioned over a top surface of the first ILD; a first interconnect line extending through the hardmask and into the first ILD; a second interconnect line extending through the hardmask and into the first ILD, wherein a top surface of the second interconnect line is a different material than a top surface the first interconnect line, wherein the via opening exposes the top surface of the first interconnect line and at least a portion of the top surface of the second interconnect line; selectively grafting a catalyst agent onto the exposed portions of the second interconnect line; filling the via opening with a dielectric; forming an isolation layer over the exposed portions of the second interconnect line by cross-linking portions of the dielectric with a baking operation that provides enough energy to initiate the cross-linking operation only in the presence of the catalyst agent; removing the portions of the dielectric that are not cross-linked from the via opening; and filling the via opening with a conductive material to form a via.

Additional embodiments include a method of forming a via, wherein the catalyst agent is bonded to the exposed portions of the second interconnect line by hydrogen bonding or electrostatic bonding.

Additional embodiments include a method of forming a via, wherein the catalyst agent is a Lewis acid or a Bronsted acid.

Additional embodiments include a method of forming a via, wherein the catalyst agent is covalently bonded to a grafting group, and wherein the grafting group is selectively bonded to the exposed portions of the second interconnect line.

Additional embodiments include a method of forming a via, wherein the grafting group is a chlorosilane, an alkoxysilane, an amino silane, a siloxane, a silyl chloride, an alkene, an alkyne, an amine, a phosphine, a thiol, a phosphonic acid, or a carboxylic acid, and wherein the catalyst agent is an acid generator based on onium salts.

Additional embodiments include a method of forming a via, wherein selectively grafting a catalyst agent onto the exposed portions of the second interconnect line comprises grafting the catalyst agent over the surfaces exposed in the bottom of the via opening and patterning the catalyst agent to remove catalyst agent from the first interconnect line and the hardmask.

Additional embodiments include a method of forming a via, wherein the cap is removed after the dielectric material is cross-linked and prior to filling the via opening to form the via.

Additional embodiments include a method of forming a via, wherein the baking operation is a low temperature bake that is less than approximately 300° C.

Additional embodiments include a method of forming a via, wherein the dielectric material is based on 1,3,5-trisilacyclohexane.

Additional embodiments include a method of forming a via, further comprising: forming a second via opening through the second ILD, wherein the second via opening exposes the top surface of the second interconnect line and at least a portion of the top surface of the first interconnect line; selectively grafting a second catalyst agent onto the exposed portions of the first interconnect line; filling the via opening with a second dielectric; forming a second isolation layer over the exposed portions of the first interconnect line by cross-linking portions of the second dielectric with a baking operation that provides enough energy to initiate the cross-linking operation only in the presence of the second catalyst agent; removing the portions of the second dielectric that are not cross-linked from the second via opening; and filling the second via opening with a conductive material to form a via.

Embodiments of the invention include an interconnect structure comprising: a first interlayer dielectric (ILD); a first interconnect line extending into the first ILD, wherein a cap is formed on a top surface of the first interconnect line; a second interconnect line extending into the first ILD, wherein the second interconnect line is a different material than the cap; a second ILD positioned above the cap and the second interconnect line; a via extending through the second ILD and electrically coupled to the first interconnect line by the cap, wherein a portion of a bottom surface of the via is positioned above the second interconnect line, and wherein the second ILD is formed above a portion of the second interconnect line; and an insulation layer positioned between the bottom surface of the via and the top surface of the second interconnect line, wherein a sidewall of the isolation layer contacts a sidewall of the second ILD.

Additional embodiments of the invention include an interconnect structure, wherein the isolation layer is a cross-linked dielectric layer.

Additional embodiments of the invention include an interconnect structure, wherein the isolation layer is based on 1,3,5-trisilacyclohexane.

What is claimed is:
1. An interconnect structure comprising:
   a first interlayer dielectric (ILD);
   a first interconnect line extending into the first ILD;
   a second interconnect line extending into the first ILD;
   a second ILD positioned over the first interconnect line and the second interconnect line;
   a via extending through the second ILD and electrically coupled to the first interconnect line, wherein a portion of a bottom surface of the via is positioned over the second interconnect line; and
   an isolation layer positioned between the bottom surface of the via and a top surface of the second interconnect line.
2. The interconnect structure of claim 1, wherein a cap is formed over the first interconnect line, and wherein the cap is a different material than the second interconnect line.

3. The interconnect structure of claim 2, wherein the cap is a metal, an alloy, an intermetallic, a germanide, or a silicide.

4. The interconnect structure of claim 3, wherein the cap is Cu, W, Ru, Co, Mo, Ni, Pt, Pd, Ta, Ti, RuTa, TaN, TiN, WCN, $Cu_3Ge$, or $Ni_xSi_y$.

5. The interconnect structure of claim 1, wherein a cap is formed over the second interconnect line, and wherein the cap is a different material than the first interconnect line.

6. The interconnect structure of claim 1, wherein a bottom surface of the isolation layer contacts a top surface of a hardmask.

7. The interconnect structure of claim 6, wherein the isolation layer has a thickness that is approximately half of a distance between a center of the first interconnect line and a center of the second interconnect line.

8. The interconnect structure of claim 1, wherein the first interconnect line is a different material from the second interconnect line.

9. The interconnect structure of claim 1, wherein the isolation layer does not extend across the entire width of the top surface of the second interconnect line.

10. The interconnect structure of claim 1, wherein the isolation layer is a cross-linked dielectric layer.

11. The interconnect structure of claim 10, wherein the isolation layer is based on 1,3,5-trisilacyclohexane.

12. The interconnect structure of claim 1, wherein a grafting group is formed between the bottom surface of the isolation layer and a top surface of the second interconnect line.

13. An interconnect structure comprising:
a first interlayer dielectric (ILD); a first interconnect line extending into the first ILD, wherein a cap is formed on a top surface of the first interconnect line;
a second interconnect line extending into the first ILD, wherein the second interconnect line is a different material than the cap;
a second ILD positioned above the cap and the second interconnect line; a via extending through the second ILD and electrically coupled to the first interconnect line by the cap, wherein a portion of a bottom surface of the via is positioned above the second interconnect line, and wherein the second ILD is formed above a portion of the second interconnect line; and
an isolation layer positioned between the bottom surface of the via and the top surface of the second interconnect line, wherein a sidewall of the isolation layer contacts a sidewall of the second ILD.

14. The interconnect structure of claim 13, wherein the isolation layer is a cross-linked dielectric layer.

15. The interconnect structure of claim 14, wherein the isolation layer is based on 1,3,5-trisilacyclohexane.

* * * * *